(12) United States Patent
Chen (10) Patent No.: US 7,196,428 B2
(45) Date of Patent: Mar. 27, 2007

(54) BOND PAD STRUCTURE FOR INTEGRATED CIRCUIT CHIP

(75) Inventor: Hsien-Wei Chen, Sinying (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 20 days.

(21) Appl. No.: 11/058,392

(22) Filed: Feb. 15, 2005

(65) Prior Publication Data
US 2006/0180946 A1 Aug. 17, 2006

(51) Int. Cl.
*H01L 23/52* (2006.01)

(52) U.S. Cl. .................... 257/786; 257/E23.05

(58) Field of Classification Search ........... 257/786, 257/E23.05
See application file for complete search history.

(56) References Cited

U.S. PATENT DOCUMENTS

| | | | |
|---|---|---|---|
| 5,514,892 A * | 5/1996 | Countryman et al. | 257/355 |
| 5,736,791 A * | 4/1998 | Fujiki et al. | 257/781 |
| 6,287,950 B1 | 9/2001 | Wu et al. | |
| 6,306,750 B1 | 10/2001 | Huang et al. | |
| 6,455,943 B1 | 9/2002 | Sheu et al. | |
| 6,524,942 B2 | 2/2003 | Tsai et al. | |
| 6,614,091 B1 | 9/2003 | Downey et al. | |
| 6,677,228 B1 | 1/2004 | Su et al. | |
| 6,709,965 B1 | 3/2004 | Chen et al. | |
| 6,919,621 B2 * | 7/2005 | Hsu | 257/666 |

* cited by examiner

*Primary Examiner*—N. Drew Richards
*Assistant Examiner*—Mohammad Timor Karimy
(74) *Attorney, Agent, or Firm*—Slater & Matsil, L.L.P.

(57) ABSTRACT

An integrated circuit chip is provided, which includes a bond pad structure. The bond pad structure includes a bond pad, a first metal plate, and a second metal plate. The first metal plate is located under the bond pad. The first metal plate has a first outer profile area. The second metal plate is located under the first metal plate. A cumulative top view outer profile area of the first metal plate and the second metal plate is larger than the first outer profile area of the first metal plate. The second metal plate may have a second outer profile area that is substantially equal to or larger than the first outer profile area. A first vertical axis may extend through a centroid of the first metal plate, and a centroid of the second metal plate may be laterally offset relative to the first vertical axis.

19 Claims, 11 Drawing Sheets

BOND PAD STRUCTURE FOR INTEGRATED CIRCUIT CHIP

TECHNICAL FIELD

The present invention generally relates to bond pad structures for integrated circuit chips. In one aspect, it relates more particularly to bond pad structures for preventing interconnect peeling and improving bondability.

BACKGROUND

Integrated circuit (IC) chips are often electrically connected by wires (e.g., gold or aluminum wires) to a leadframe or a substrate in a packaging assembly to provide external signal exchange. Such wires are typically wire bonded to bond pads formed on an IC chip using thermal compression and/or ultrasonic vibration. A wire bonding process exerts thermal and mechanical stresses on a bond pad and on the underlying layers and structure below the bond pad. The bond pad structure needs to be able to sustain these stresses to ensure a good bonding of the wire and to prevent damage to the IC chip.

Alternative bond pad structures were fabricated from the bottom to the top layers, which did not allow metal wiring circuitry and semiconductor devices to pass under or be located below the bond pad structure. For a more efficient use of chip area or to reduce the chip size, it is desirable to form semiconductor devices and metal wiring circuitry under the bond pad. This is sometimes referred to as bond over active circuits (BOAC) or circuits under pad (CUP). At the same time, many processes now use low-k and ultra low-k dielectric materials for the intermetal dielectric (IMD) layers to reduce RC delay and parasitic capacitances. The general trend in IMD designs is that the dielectric constant (k) tends to decrease from the top downward toward the substrate. However, as the dielectric constant (k) decreases, typically the strength of the dielectric material decreases (as a general rule). Hence, many low-k dielectric materials are highly susceptible to cracking or lack strength needed to withstand some mechanical processes (e.g., wire bonding, CMP). Not only do low-k dielectric materials tend to be relatively weak in compression strength, they also tend to be weak in adhesion strength.

During a typical wire bonding procedure, the bond pad structure must withstand compressive and lateral shear forces during the ball squishing stage of wire bonding. These forces may cause cracking in the relatively weak low-k dielectric layers. The bond pad structure must also withstand pulling and torsional forces while the wire is being pulled from the wire bonding tool relative to the bond pad on the chip. These forces may cause peeling or dislocation of the bond pad structure. Hence, there is a need for a bond pad structure that can sustain and better disperse the stresses exerted on it by a wire bonding process, that is compatible with the use of low-k dielectric materials for intermetal dielectric layers, and that will also allow circuitry and devices to be formed under the bond pad.

SUMMARY OF THE INVENTION

The problems and needs outlined above may be addressed by embodiments of the present invention. In accordance with one aspect of the present invention, an integrated circuit chip is provided, which includes a bond pad structure. The bond pad structure includes a bond pad, a first metal plate, and a second metal plate. The first metal plate is located under the bond pad. The first metal plate has a first outer profile area. The second metal plate is located under the first metal plate. Hence, a cumulative top view outer profile area of the first metal plate and the second metal plate is larger than the first outer profile area of the first metal plate. The second metal plate may have a second outer profile area that is substantially equal to or larger than the first outer profile area. A first vertical axis may extend through a centroid of the first metal plate, and a centroid of the second metal plate may be laterally offset relative to the first vertical axis. Also, a second vertical axis may extend through a centroid of the second metal plate, and a third metal plate (of the bond pad structure) may be located under the second metal plate; the third metal plate having a third outer profile area, the third outer profile area being substantially equal to or larger than the first outer profile area, a centroid of the third metal plate being laterally offset relative to the first vertical axis, the third outer profile area being substantially equal to or larger than the second outer profile area, the centroid of the third metal plate being laterally offset relative to the second vertical axis, and a cumulative top view outer profile area of the first, second, and third metal plates being larger than the third outer profile area. The bond pad structure may further include a third metal plate located under the second metal plate, such that a cumulative top view outer profile area of the first, second, and third metal plates is larger than the first outer profile area of the first metal plate. The first metal plate may have a hollow central portion, slots formed therein, or a solid plate structure, for example. The bond pad structure may further include vias connecting between the first metal plate and the second metal plate. The bond pad has a bond pad outer profile area, and the first outer profile area may be substantially equal to or larger than the bond pad outer profile area. The second metal plate has a second outer profile area, and the second outer profile area may be larger than the first outer profile area. The bond pad structure may further include a third metal plate located under the second metal plate, the third metal plate has a third outer profile area, and the third outer profile area may be larger than the second outer profile area. The chip may have at least part of an integrated circuit located under the bond pad structure.

In accordance with another aspect of the present invention, an integrated circuit chip is provided, which includes a bond pad structure. The bond pad structure includes a bond pad, a first metal plate, and a second metal plate. The first metal plate is located under the bond pad. A first vertical axis extends through a centroid of the first metal plate. The second metal plate is located under the first metal plate. A centroid of the second metal plate is laterally offset relative to the first vertical axis.

In accordance with yet another aspect of the present invention, an integrated circuit chip is provided, which includes a bond pad structure. The bond pad structure includes a bond pad, a first metal plate, a second metal plate, and a third metal plate. The first metal plate is located under the bond pad. The first metal plate has a first outer profile area. A first vertical axis extends through a centroid of the first metal plate. The second metal plate is located under the first metal plate. The second metal plate has a second outer profile area. The second outer profile area is substantially equal to or larger than the first outer profile area. A centroid of the second metal plate is laterally offset relative to the first vertical axis. A second vertical axis extends through a centroid of the second metal plate. The third metal plate is located under the second metal plate. The third metal plate has a third outer profile area. The third outer profile area is substantially equal to or larger than the first outer profile area. A centroid of the third metal plate is laterally offset relative to the first vertical axis. The third outer profile area is substantially equal to or larger than the second outer profile area. The centroid of the third metal plate is also laterally offset relative to the second vertical axis. Hence, a cumulative top view outer profile area of the first, second, and third metal plates is larger than the third outer profile area.

In accordance with still another aspect of the present invention, an integrated circuit chip is provided, which includes a bond pad structure. The bond pad structure includes a bond pad, a first metal plate, a second metal plate, and a third metal plate. The first metal plate is located under the bond pad. The first metal plate has a first outer profile area. The second metal plate is located under the first metal plate. The second metal plate has a second outer profile area. The second outer profile area is larger than the first outer profile area. The third metal plate is located under the second metal plate. The third metal plate has a third outer profile area. The third outer profile area is larger than the second outer profile area.

In accordance with another aspect of the present invention, an integrated circuit chip is provided, which includes a first bond pad structure and a second bond pad structure. The first bond pad structure includes a first bond pad, a first $M_1$ metal plate, and a first $M_2$ metal plate. The first $M_1$ metal plate is on an $M_1$ metal level. A first vertical axis extends through a centroid of the first $M_1$ metal plate. The first $M_2$ metal plate is on an $M_2$ metal level. The $M_2$ metal level is located under the $M_1$ metal level. The first $M_2$ metal plate is located under the first $M_1$ metal plate. A centroid of the first $M_2$ metal plate is laterally offset relative to the first vertical axis. The second bond pad structure includes a second bond pad, a second $M_1$ metal plate, and a second $M_2$ metal plate. The second $M_1$ metal plate is on the $M_1$ metal level. A second vertical axis extends through a centroid of the second $M_1$ metal plate. The second $M_2$ metal plate is on the $M_2$ metal level. The second $M_2$ metal plate is located under the second $M_1$ metal plate. A centroid of the second $M_2$ metal plate is laterally offset relative to the second vertical axis. The first $M_1$ metal plate is formed adjacent to the second $M_1$ metal plate along a first lateral axis extending along the $M_1$ metal level according to an $M_1$ layout pattern pitch. The first $M_2$ metal plate is formed adjacent to the second $M_2$ metal plate along a second lateral axis extending along the $M_2$ metal level according to an $M_2$ layout pattern pitch. The $M_2$ layout pattern pitch is substantially the same as the $M_1$ layout pattern pitch.

In accordance with still another aspect of the present invention, a method of making an integrated circuit chip including a bond pad structure is provided. This method includes the following steps described in this paragraph. The actual order of the steps may vary from the order listed in this paragraph. The bond pad structure includes a bond pad, a first metal plate, and a second metal plate. The second metal plate of the bond pad structure is formed. The first metal plate of the bond pad structure is formed. The first metal plate is located over the second metal plate. The first metal plate has a first outer profile area. A cumulative top view outer profile area of the first metal plate and the second metal plate is larger than the first outer profile area of the first metal plate. The bond pad of the bond pad structure is formed. The bond pad is located over the first metal plate.

In accordance with yet another aspect of the present invention, a method of making an integrated circuit chip including a bond pad structure is provided. This method includes the following steps described in this paragraph. The actual order of the steps may vary from the order listed in this paragraph. The bond pad structure includes a bond pad, a first metal plate, and a second metal plate. The second metal plate of the bond pad structure is formed. The first metal plate of the bond pad structure is formed. The first metal plate is located over the second metal plate. A first vertical axis extends through a centroid of the first metal plate. A centroid of the second metal plate is laterally offset relative to the first vertical axis. A bond pad of the bond pad structure is formed. The bond pad is located over the first metal plate.

The foregoing has outlined rather broadly features of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which.

DETAILED DESCRIPTION OF ILLUSTRATIVE EMBODIMENTS

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Generally, an embodiment of the present invention provides an improved bond pad structure for an integrated circuit (IC) chip, especially those having circuits under the bond pad and incorporating low-k dielectric materials for the intermetal dielectric (IMD) layers. First, with reference to FIGS. 1 and 2, an alternative bond pad structure design will be shown and briefly described, for purposes of comparison. Next, two illustrative embodiments of the present invention will be shown and described to illustrate examples of improved bond pad structures in accordance with the present invention. A first illustrative embodiment of the present invention will be described with reference to FIGS. 3 and 4, and a second illustrative embodiment of the present invention will be described with reference to FIGS. 5 and 6. With reference to FIGS. 7A–7G, some examples of alternative metal plate shapes and designs that may be incorporated into a bond pad structure of an embodiment will be shown and briefly described. Finally, the graph shown in FIG. 8 will then be described. Some of the advantages, benefits, and alternatives provided by the embodiments of the present invention will be described as well along the way.

Figure 1:
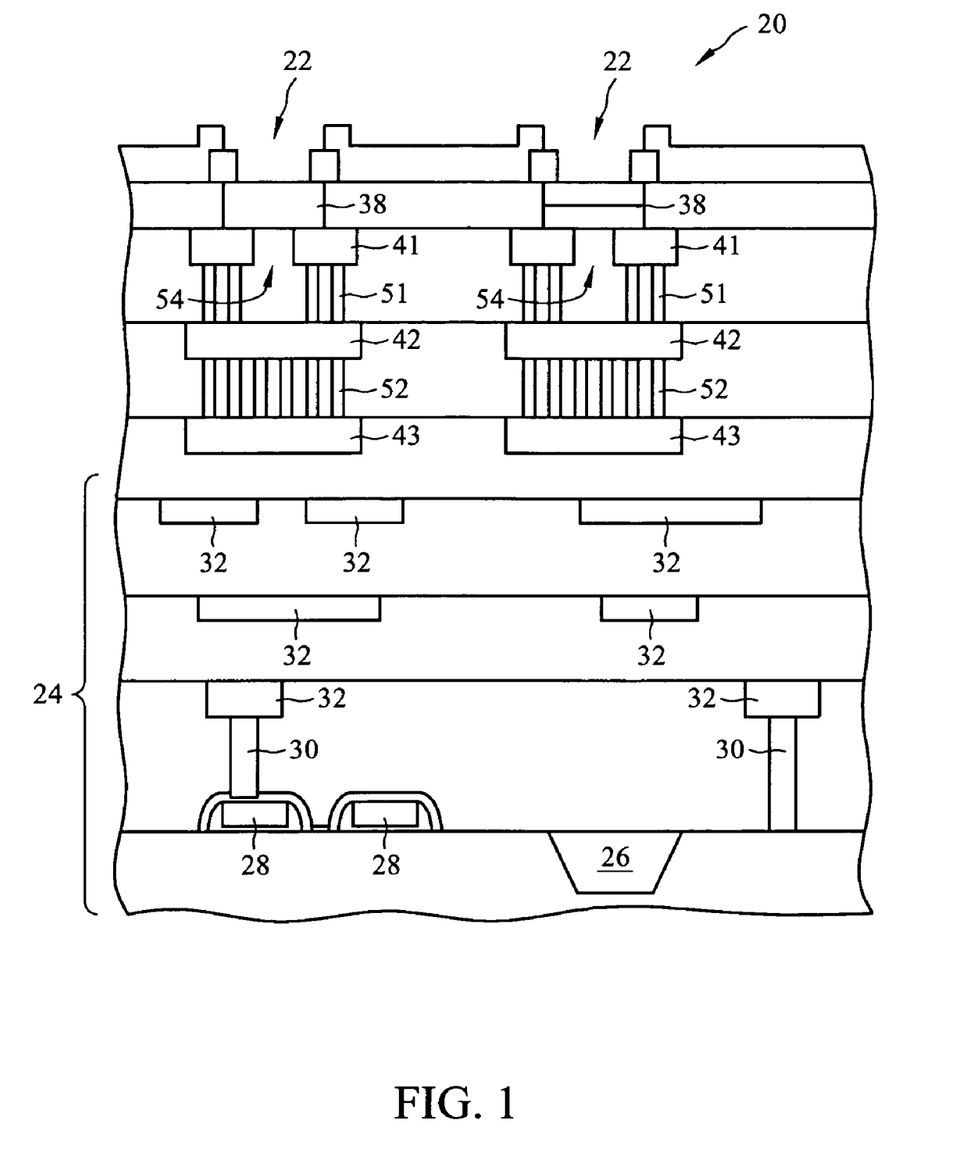
FIG. 1 is a cross-section view showing part of an IC chip with an alternative bond pad structure design incorporated therein for a circuit under pad layout.
Figure 2:
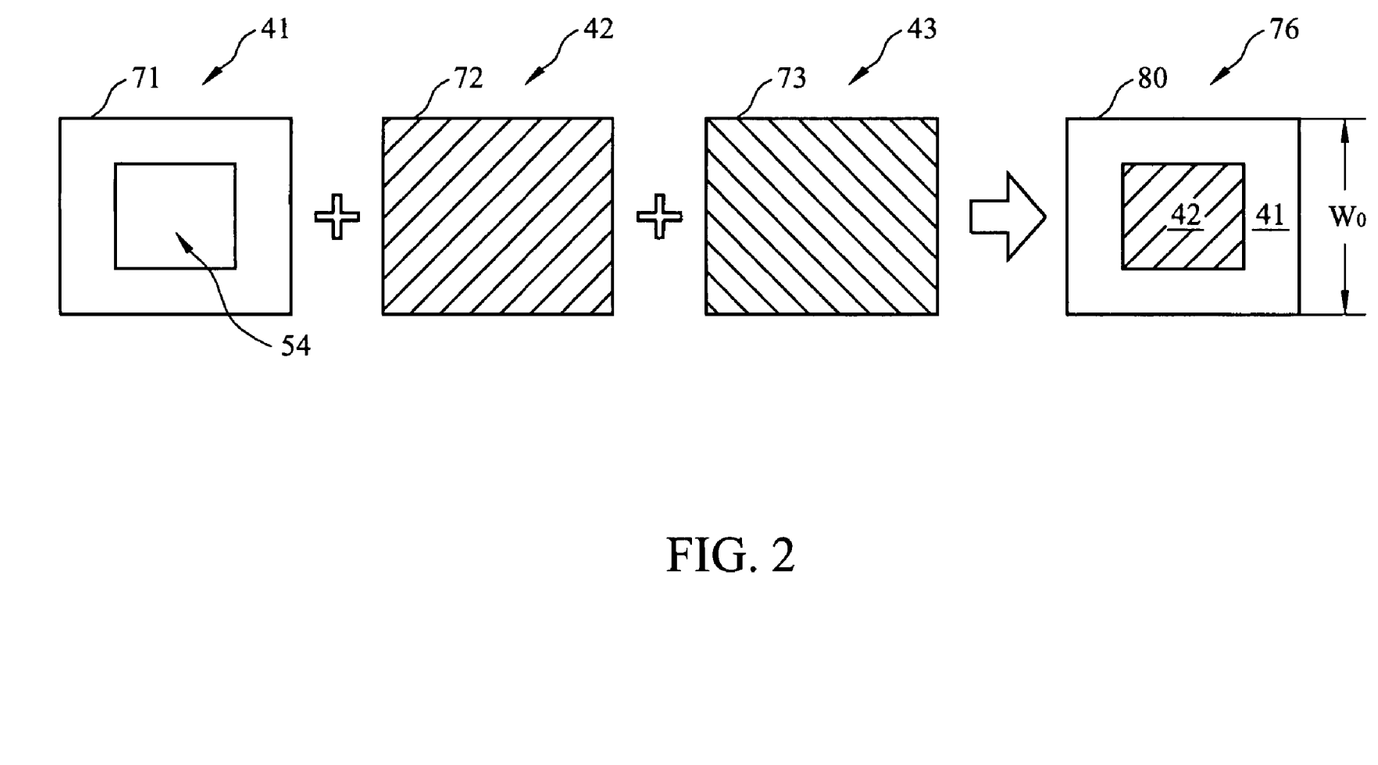
FIG. 2 shows top views of various metal plates from various levels of the alternative bond pad structure of FIG. 1.

Referring now to FIG. 1 and 2, pan of an IC chip 20 is shown in a cross-section view to illustrate an alternative bond pad structure design 22. The bond pad structures 22 are formed over at least part of an integrated circuit 24. Some example parts (e.g., isolation region 26, gate electrodes 28, contacts 30, interconnect wiring 32) of the integrated circuit 24 are shown for purposes of illustration. Each bond pad structure 22 of FIG. 1 includes a bond pad 38, a first metal plate 41, a first set of vias 51, a second metal plate 42, a second set of vias 52, and a third metal plate 43. FIG. 2 shows simplified top views of these metal plates 41, 42, 43. The first metal plate 41 is located under the bond pad 38. The second metal plate 42 is located under the first metal plate 41. The first set of vias 51 connects between the first metal plate 41 and the second metal plate 42 for providing a mechanical connection between these plates. The third metal plate 43 is located under the second metal plate 42. The second set of vias 52 connects between the second metal plate 42 and the third metal plate 43 for providing a mechanical connection between these plates.

As shown in FIG. 2, the first metal plate 41 has a hollow central portion 54. The second and third metal plates 42, 43 each has a solid plate structure. The remainder of FIG. 2 will be discussed further below.

Figure 3:
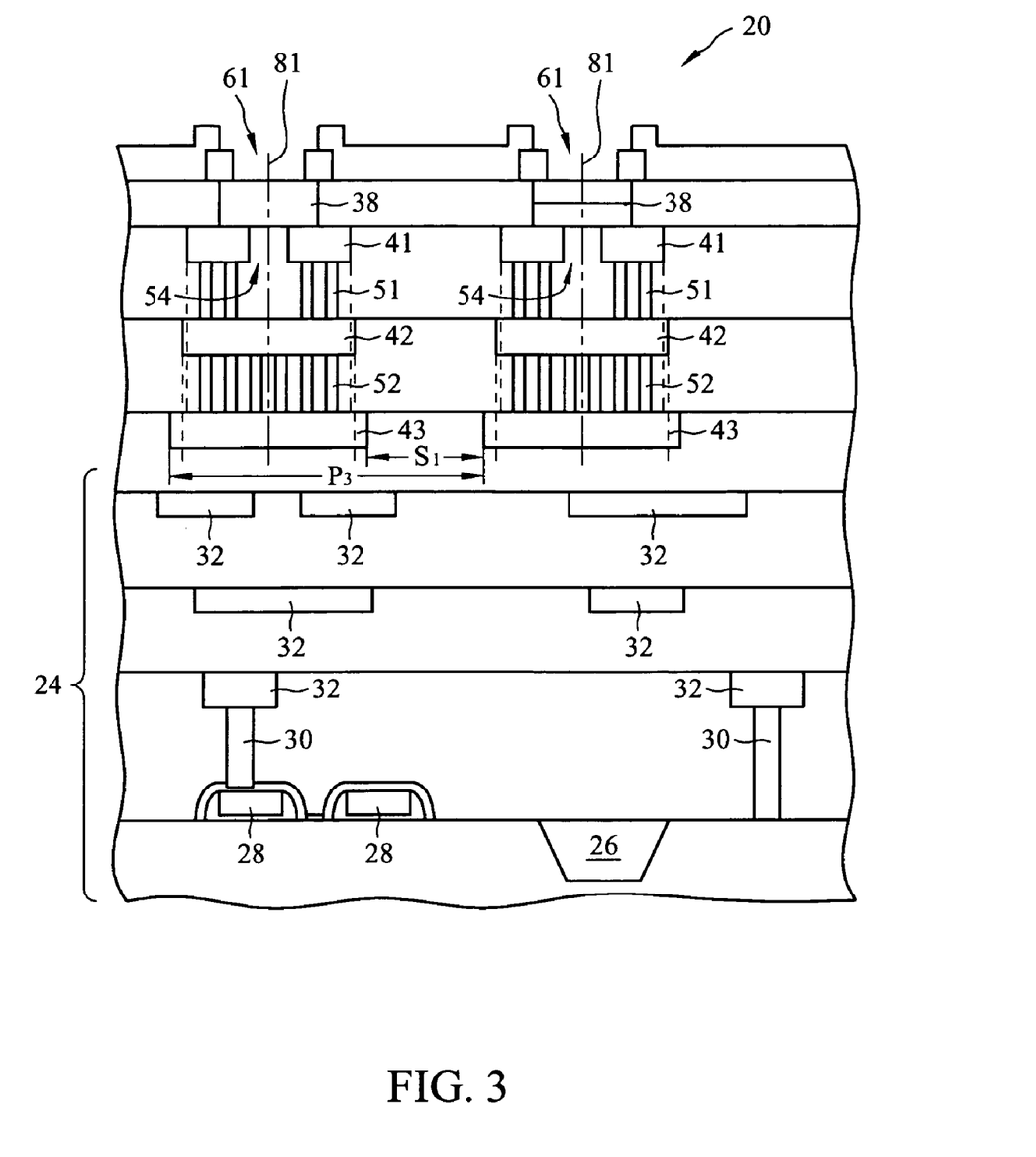
FIG. 3 is a cross-section view showing part of an IC chip incorporating bond pad structures in accordance with a first embodiment of the present invention.
Figure 4:
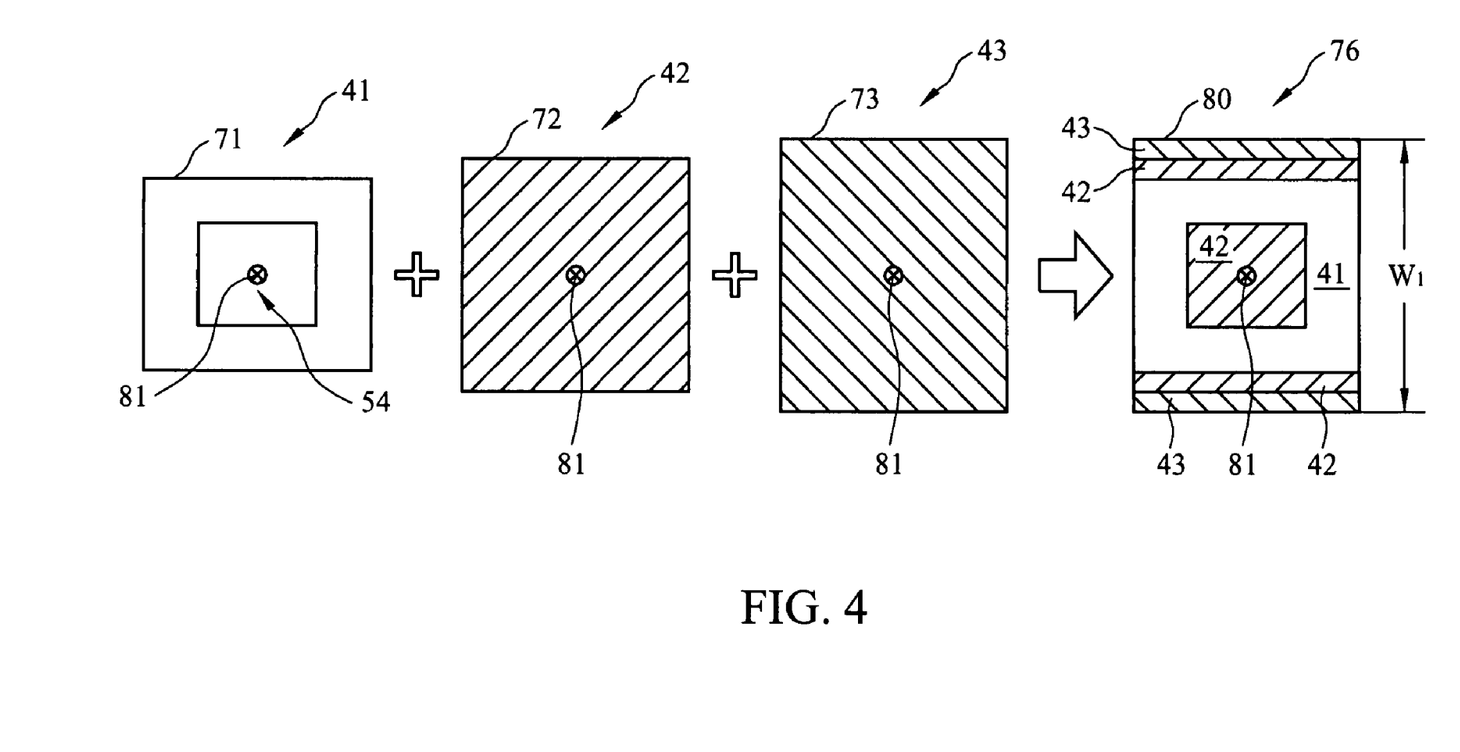
FIG. 4 shows top views of various metal plates from various levels of a bond pad structure for the first embodiment of FIG. 3.

FIGS. 3 and 4 show a bond pad structure 61 of a first illustrative embodiment of the present invention. A bond pad structure 61 of the first embodiment may be substituted for the alternative bond pad structure 22 shown in FIG. 1, as an improvement, for example. The bond pad structures 61 of the first embodiment are formed over at least part of an integrated circuit 24. The same example parts of the integrated circuit 24 shown in FIG. 1 are shown in FIG. 3, for purposes of illustration. In other embodiments, other portions and other types of an integrated circuit may be formed under a bond pad structure 61 of the embodiment.

Each bond pad structure 61 of FIG. 3 includes a bond pad 38, a first metal plate 41, a first set of vias 51, a second metal plate 42, a second set of vias 52, and a third metal plate 43. FIG. 4 shows simplified top views of these metal plates 41, 42, 43 of the first embodiment. The first metal plate 41 is located under the bond pad 38. The first metal plate 41 has a first outer profile area 71. The first outer profile area 71 is shown in dashed lines, for purposes of illustration (see e.g., FIG. 4). An "outer profile area" of a plate is the area of an outer profile of the metal plate in a top view. Thus, whether a plate has slots or hollow portions formed therein does not effect the outer profile area for purposes of discussion herein.

The first metal plate 41 of the first embodiment has a hollow central portion 54 (see FIG. 4) like that of the alternative design 22 (see FIG. 2). This hollow central portion will typically be filled with dielectric material of the surrounding IMD layer(s).

The second metal plate 42 is located under the first metal plate 41, as shown in FIG. 3. The second metal plate 42 has a second outer profile area 72 (see top view in FIG. 4). The second outer profile area 72 is show in dashed lines, for purposes of illustration. In the first embodiment, the second outer profile area 72 of the second metal plate 42 is larger than the first outer profile area 71 of the first metal plate 41. In other embodiments, however, the second outer profile area 72 of the second metal plate 42 may be substantially equal to or larger than the first outer profile area 71 of the first metal plate 41. The first set of vias 51 connects between the first metal plate 41 and the second metal plate 42 for providing a mechanical connection between these plates. Although preferred, the first set of metal vias 51 is optional in an embodiment of the present invention. Furthermore, the placement, shape, size, via-fill material(s), and number of the vias in the first set of vias 51 may vary in other embodiments.

The third metal plate 43 is located under the second metal plate 42, as also shown in FIG. 3. The third metal plate 43 has a third outer profile area 73 (see top view in FIG. 4). The third outer profile area 73 is show in dashed lines, for purposes of illustration. In the first embodiment, the third outer profile area 73 of the third metal plate 43 is larger than the second outer profile area 72 of the second metal plate 42. In other embodiments, however, the third outer profile area 73 of the third metal plate 43 may be substantially equal to or larger than the second outer profile area 72 of the second metal plate 42. Also, the third outer profile area 73 of the third metal plate 43 in the first embodiment is larger than the first outer profile area 71 of the first metal plate 41. The third outer profile area 73 of the third metal plate 43 may be substantially equal to or larger than the first outer profile area 71 of the first metal plate 41 in other embodiments. The second set of vias 52 connects between the second metal plate 42 and the third metal plate 43 for providing a mechanical connection between these plates. Although preferred, the second set of metal vias 52 is optional in an embodiment of the present invention. Furthermore, the placement, shape, size, via-fill material(s), and number of the vias in the second set of vias 52 may vary in other embodiments.

Next, FIG. 4 will be compared to FIG. 2 to show how the bond pad structure 61 of the first embodiment is improved over the bond pad structure 22 of FIG. 2. In FIG. 2, a cumulative top view 76 of the first, second, and third metal plates 41, 42, 43 is shown. The second and third metal plates 42, 43 are located under the first metal plate 41 in FIG. 2, just as in FIG. 1. Simplified equations illustrating and further explaining this point are provided and discussed below. Note that the second and third outer profile areas 72, 73 of the second and third metal plates 42, 43, respectively, are substantially equal to the first outer profile area 71 of the first metal plate 41 in the structure 22 of FIGS. 1 and 2. The cumulative top view outer profile area 80 of the first, second, and third metal plates 41, 42, 43 (in FIG. 2) is substantially the same as the first outer profile area 71 of the first metal plate 41. In comparison, a cumulative top view 76 of the first, second, and third metal plates 41, 42, 43 of the first embodiment is shown in FIG. 4. The cumulative top view outer profile area 80 is shown in a thick solid line in each of FIGS. 2 and 4, for purposes of illustration. The cumulative top view outer profile area 80 of the first, second, and third metal plates 41, 42, 43 of the first embodiment (see FIG. 4) is larger than the first outer profile area 71 of the first metal plate 41.

Also, the cumulative top view outer profile area 80 of the first embodiment (see FIG. 4) is larger than the cumulative top view outer profile area 80 for the bond pad structure 22 of FIG. 2. Thus, assuming all other factors (materials, size and shape of bond pad and first metal plate) are the same for purposes of discussion and comparison, the bond pad structure 61 of the first embodiment will provide a stronger structure that can withstand greater forces exerted on it (e.g., during wire bonding process) than that of the alternative design 22 of FIGS. 1 and 2, due to the increased cumulative top view outer profile area 80. Simplified equations illustrating and further explaining this point are provided and discussed below. Note also that the dimension $W_1$ of the first embodiment (see FIG. 4) is larger than the dimension $W_0$ of the alternative design (see FIG. 2). Although the cumulative top view outer profile area 80 of the first embodiment (see FIG. 4) is larger than the cumulative top view outer profile area 80 of the alternative bond pad structure 22 (see FIG. 2) along only one direction (i.e., $W_1$ vs. $W_0$), the cumulative top view outer profile area 80 may be larger in another direction and/or in multiple directions in other embodiments.

Depending upon the density of the bond pad structures 61 of a chip, one issue that may need to be taken into consideration is the pitch $P_3$ between adjacent bond pad structures 61 (see FIG. 3), which affects the spacing $S_1$ between the enlarged third metal plates 43 of adjacent bond pad structures 61 (see FIG. 3). There may be a limit to the size of the spacing $S_1$ between adjacent enlarged metal plates, e.g., enlarged third metal plates 43 in adjacent bond pad structures 61. As the pitch $P_3$ is decreased for a given chip design, the amount of enlargement permitted for the third metal plate 43 may be limited. In another embodiment (not shown), the second and third metal plates 42, 43 may have larger outer profile areas 72, 73 than that of the first metal plate 41, while the second and third metal plates 42, 43 have substantially equal outer profile areas 72, 73.

An imaginary first vertical axis 81 is extended through the centroid of the first metal plate 41, as shown in FIGS. 3 and 4, for purposes of discussion. In the first illustrative embodiment shown in FIGS. 3 and 4, the first vertical axis 81 also extends through the centroid of the second metal plate 42 and through the centroid of the third metal plate 43. In other embodiments, however, the centroid of the second metal plate 42 and/or the centroid of the third metal plate 43 may be laterally offset relative to the first vertical axis 81.

Figure 5:
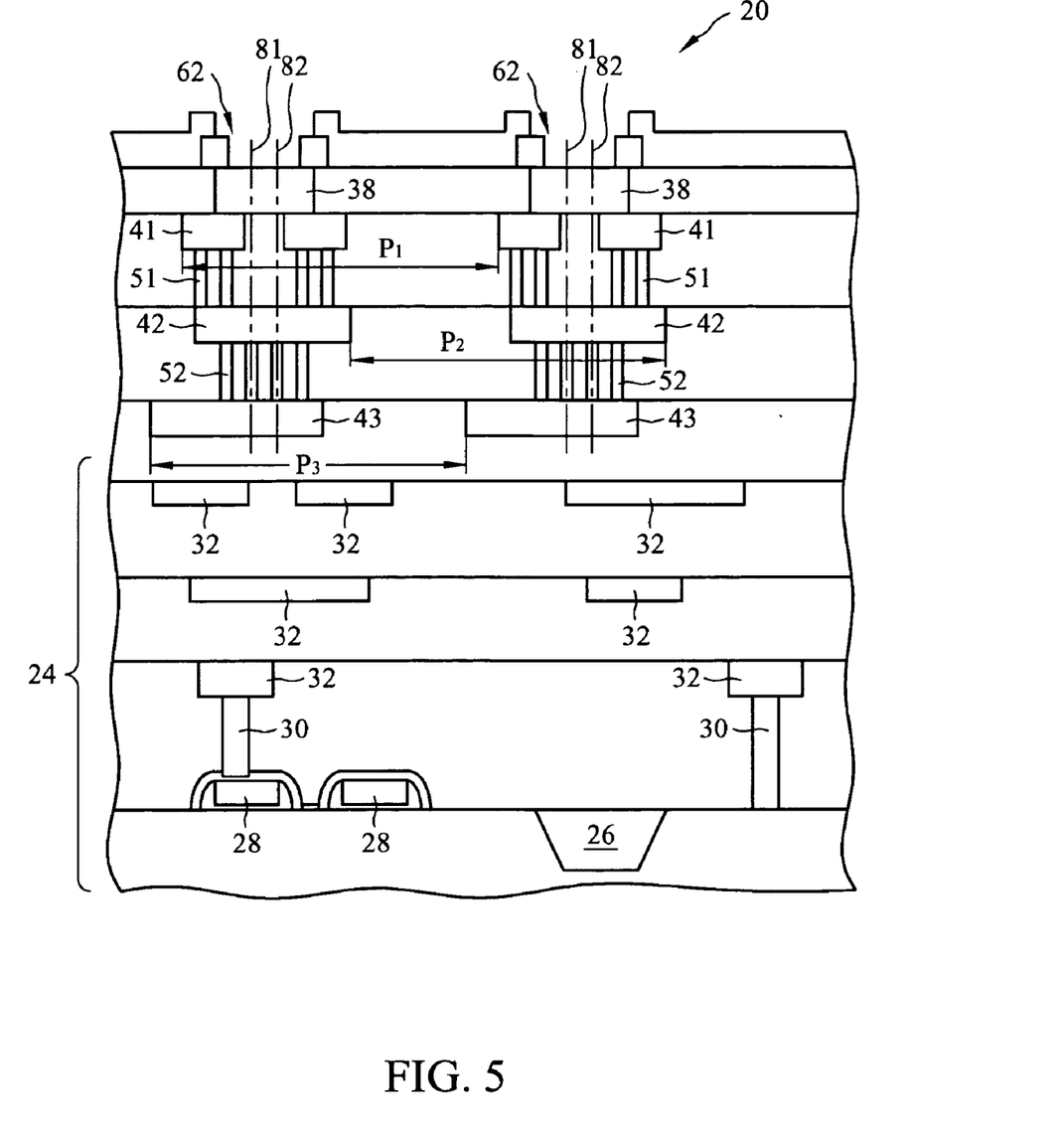
FIG. 5 is a cross-section view showing part of an IC chip incorporating bond pad structures in accordance with a second embodiment of the present invention.
Figure 6:
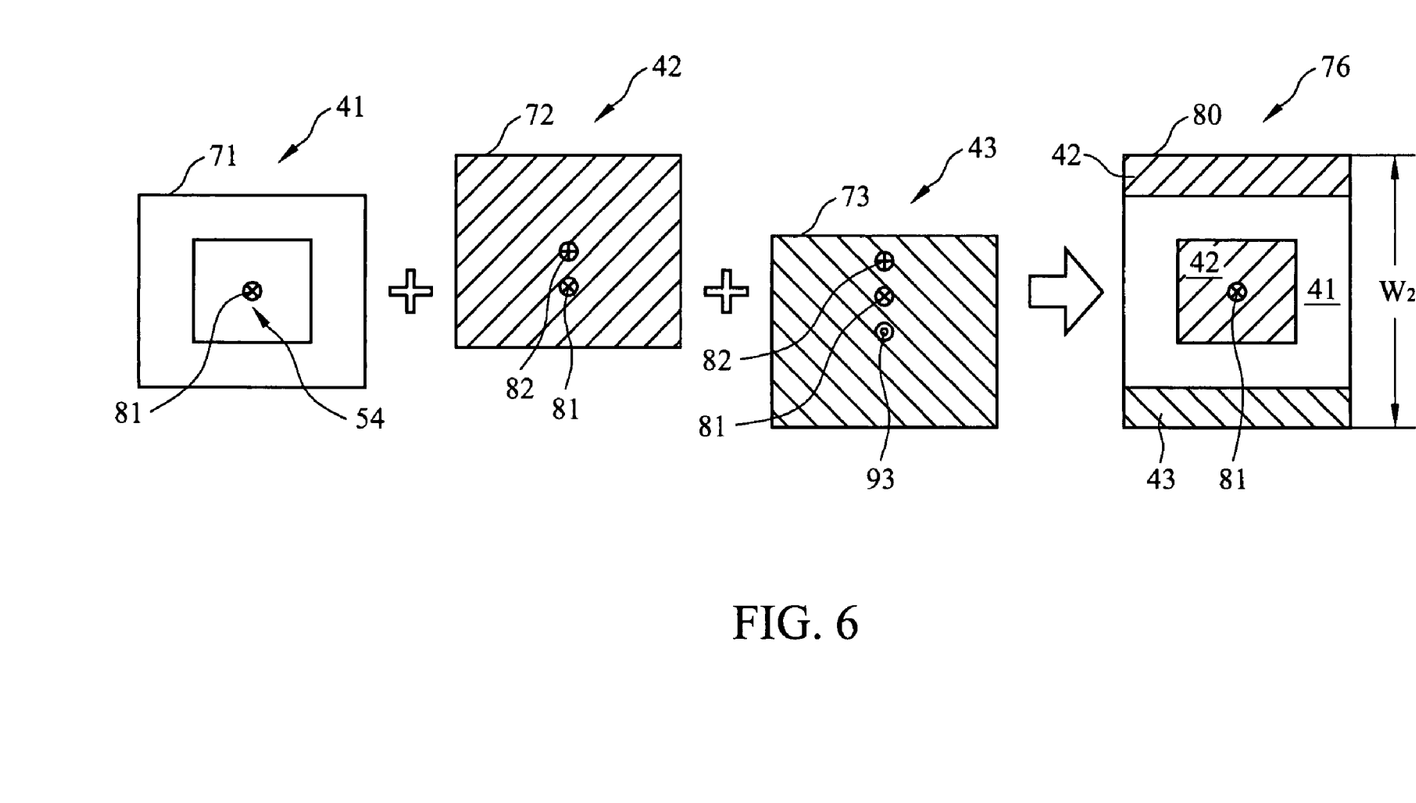
FIG. 6 shows top views of various metal plates from various levels of a bond pad structure for the second embodiment of FIG. 5.

The cumulative top view outer profile area 80 of a bond pad structure 61 may be increased in other ways for other embodiments of the present invention. For example, FIGS. 5 and 6 show a second illustrative embodiment of the present invention, which illustrates another way to increase the cumulative top view outer profile area 80 of the bond pad structure 62. In the second embodiment, the second and third metal plates 42, 43 have substantially equal outer profile areas 71, 72 as that of the first metal plate 41. A first vertical axis 81 extends through a centroid of the first metal plate 41. A second vertical axis 82 extends through a centroid of the second metal plate 42. The centroid of the second metal plate 42 in the second embodiment is laterally offset relative to the first vertical axis 81. Also, a centroid 93 of the third metal plate 43 of the second embodiment is laterally offset relative to the first vertical axis 81 and relative to the second vertical axis 82. Hence, the cumulative top view outer profile area 80 of the bond pad structure 62 is increased by these lateral offsets (see FIG. 6). In FIG. 6, a top view showing the second and third metal plates 42, 43 under the first metal plate 41 illustrates this point. The cumulative top view outer profile area 80 is shown in a thick solid line in FIG. 6, for purposes of illustration.

Comparing FIGS. 2 and 6, it can be seen that the cumulative top view outer profile area 80 of the second embodiment (see FIG. 6) is larger than that of the alternative design (see FIG. 2). Thus, assuming all other factors (materials, size and shape of bond pad and first metal plate) are the same for purposes of discussion and comparison, the bond pad structure 62 of the second embodiment will provide a stronger structure that can withstand greater forces exerted on it (e.g., during wire bonding process) than that of the alternative design 22 of FIGS. 1 and 2, due to the increased cumulative top view outer profile area 80. Simplified equations illustrating and further explaining this point are provided and discussed below. Note also that the dimension $W_2$ of the second embodiment (see FIG. 6) is larger than the dimension $W_0$ of the alternative design (see FIG. 2). Although the cumulative top view outer profile area 80 of the second embodiment (see FIG. 6) is larger than the cumulative top view outer profile area 80 of the alternative bond pad structure 22 (see FIG. 2) along only one direction (i.e., $W_2$ vs. $W_0$), the cumulative top view outer profile area 80 may be larger in another direction and/or in multiple directions in other embodiments.

An advantage of the second embodiment is that the cumulative top view outer profile area 80 of the bond pad structure 62 (see FIG. 6) may be increased while the pitch for each metal level may be the same. Stated another way, an advantage of the second embodiment is that the cumulative top view outer profile area 80 may be increased while not needing to increase the pitch between adjacent bond pad structures 62 and while not needing to decrease the spacing between adjacent metal plates in a same metal level. In FIG. 5, the pitch $P_1$ for the layout of first metal plates 41 of adjacent bond pad structures 62 is shown. Also, the pitch $P_2$ and $P_3$ for the layouts of the second and third metal plates 42, 43, respectively, of adjacent bond pad structures 62 are shown. As illustrated by the second embodiment, the pitches $P_1$, $P_2$, and $P_3$ of the different metal levels may be the same (i.e., $P_1 = P_2 = P_3$), but need not be for an embodiment. In other embodiments, any of the pitches for any number or combination of levels may be the same, and any of the pitches for any number or combination of levels may be different. In many cases, it will be desirable to have the same pitch between features at each metal level.

In other embodiments (not shown), however, the first vertical axis 81 and/or the second vertical axis 82 may pass through the centroid 93 of the third metal plate 43. Also, in yet another embodiment (not shown), the first vertical axis 81 may pass through the centroid of the second metal plate 42 (i.e., first and second vertical axes 81, 82 being collinear), while the centroid 93 of the third metal plate 43 is laterally offset relative to the first and second vertical axes 81, 82. In still another embodiment (not shown), the first vertical axis 81 may pass through the centroid 93 of the third metal plate 43, while the centroid of the second metal plate 42 is laterally offset relative to the first vertical axis 81.

Although the metal plates 41, 42, 43 of the first and second embodiments are shown having rectangular outer profile area shapes, these are merely illustrative shapes. In other embodiments of the present invention, any of the metal plates 41, 42, 43 may have any other suitable shape. Also, the first metal plate 41 of the first and second embodiments is shown as a plate having a hollow central portion 54. However, the first metal plate 41 of other embodiments may have any of a wide variety of suitable shapes/configurations. Likewise, although the second and third metal plates 42, 43 of the first and second embodiments are shown as solid metal plates, the second and third metal plates 42, 43 may have any of a wide variety of suitable shapes/configurations. In a preferred embodiment, the second and third metal plates 42, 43 have a solid configuration, as shown in FIGS. 1–6. FIGS. 7A–7G show some example shapes and configurations of metal plates 98 that may be incorporated into an embodiment of the present invention.

Figure 7A:
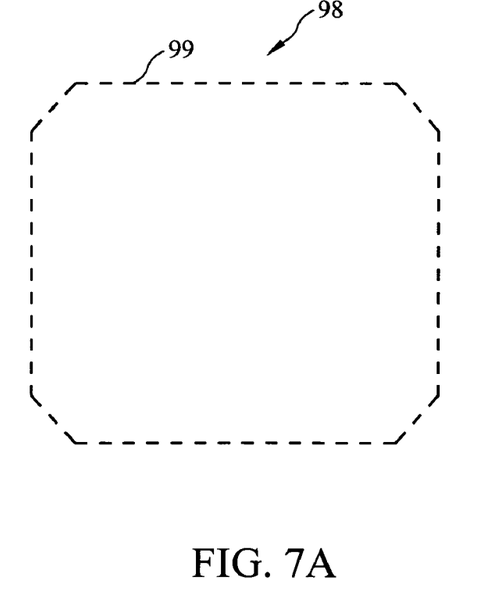
FIGS. 7A–7G are top views showing some illustrative metal plate shapes and designs that may be incorporated into a bond pad structure of an embodiment of the present invention.
Figure 7B:
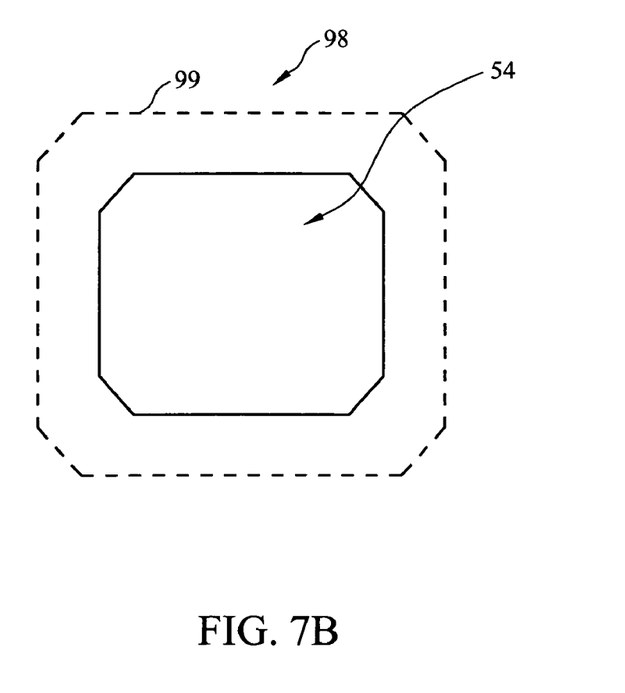
Figure 7C:
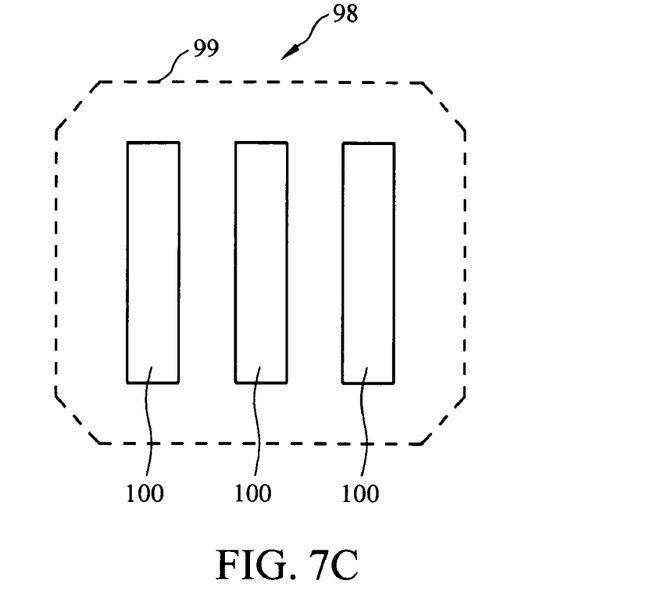
Figure 7D:
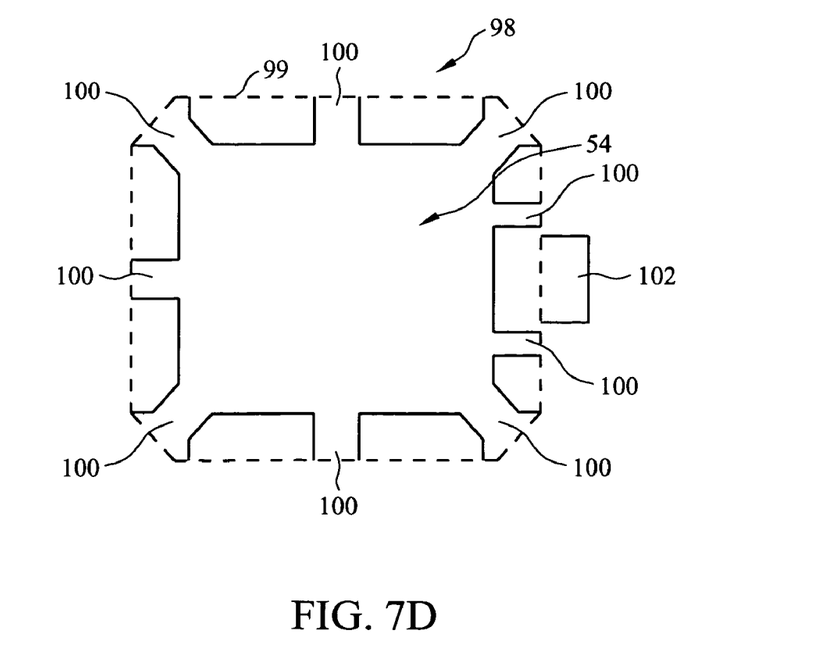
Figure 7E:
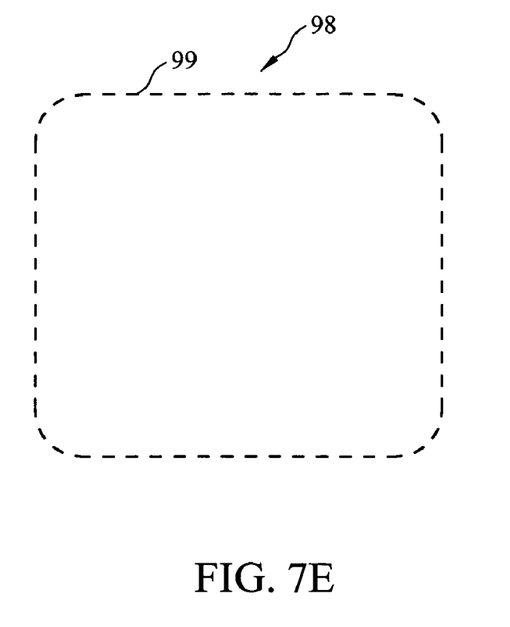
Figure 7F:
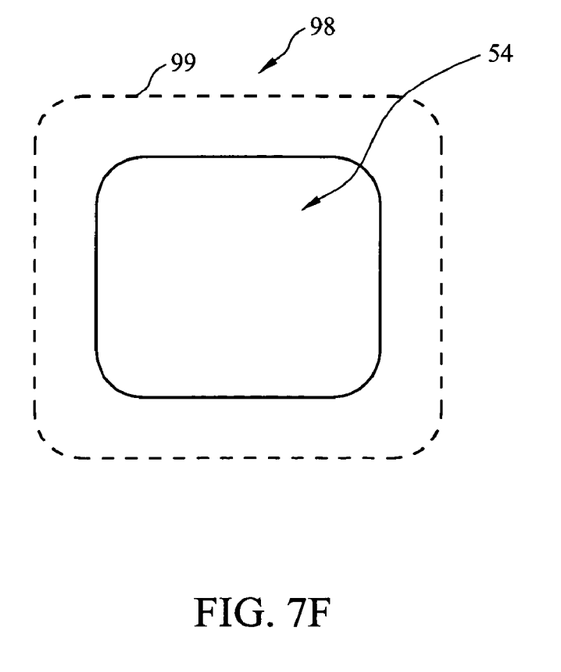
Figure 7G:
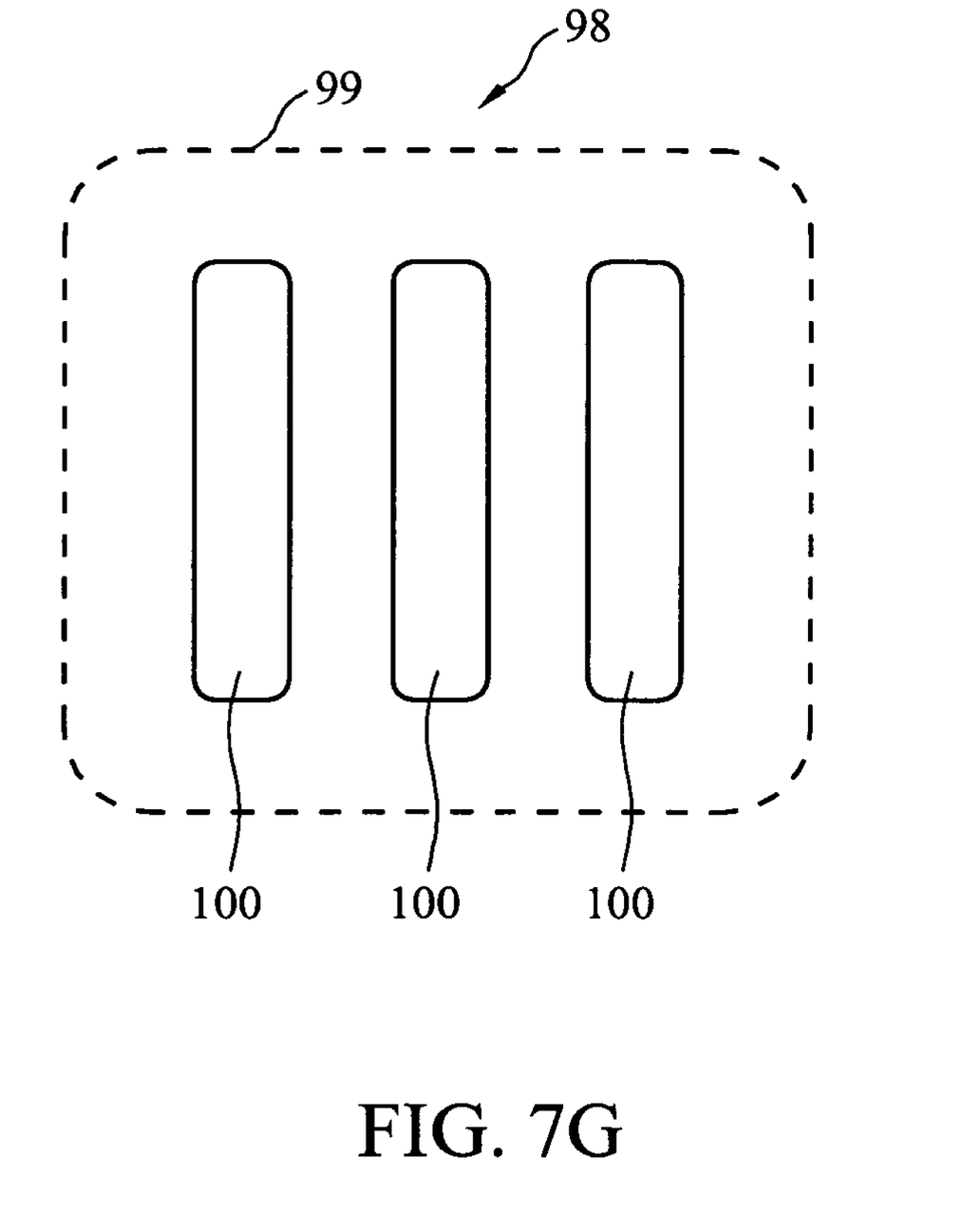

In FIGS. 7A–7G, the outer profile area 99 is shown as a dashed-line border, for purposes of illustration. In FIG. 7A, the metal plate 98 has an octagonal outer profile area shape and a solid plate configuration. FIG. 7B shows a metal plate 98 with an octagonal outer profile area shape and having a hollow central portion 54. FIG. 7C shows a metal plate 98 with an octagonal outer profile area shape and having slots 100 formed therein. FIG. 7D shows a metal plate 98 with an octagonal outer profile area shape, having a hollow central portion 54, and having slots 100 formed therein. Note also in FIG. 7D that a connection portion 102 extends from the metal plate 98, which may be used to electrically connect the metal plate 98 to wiring (not shown) of the integrated circuit. Such a connection portion 102 may have any suitable shape and may extend from any suitable portion or side of a metal plate 98 in any metal plate of an embodiment. FIG. 7E shows a metal plate 98 having a generally rectangular outer profile area shape with rounded corners and having a solid plate configuration. FIG. 7F shows a metal plate 98 having a generally rectangular outer profile area shape with rounded corners and having a hollow central portion 54. And, FIG. 7G shows a metal plate 98 having a generally rectangular outer profile area shape with rounded corners and having slots formed therein. Note that these are just a few examples shown in FIGS. 7A–7G and are in no way intended to be all possibilities.

In comparison to the alternative bond pad structure 22 (see e.g., FIGS. 1 and 2), an embodiment of the present invention having an increased cumulative top view outer profile area 80 relative to the first outer profile area 71 of the first metal plate 41 provides a bond pad structure that is reinforced and able to withstand greater forces. The following equations help to further explain this point. For the alternative structure of FIGS. 1 and 2, the maximum tension force ($F_1$) that may be exerted on the bond pad structure 22 (e.g., during a wire pulling step of wire bonding) is provided by:

$$F_1 = \sigma_1 A_1,$$

where $\sigma_1$ is the maximum adhesion strength between the third metal layer 43 and the underlying dielectric material, and $A_1$ is the cumulative top view outer profile area 80 for the alternative design 22 (see FIG. 2).

The same equation may be applied for the first or second embodiment, for example, of the present invention to estimate the maximum tension force ($F_2$) that may be exerted on the bond pad structure 61 or 62 of the embodiment:

$$F_2 = \sigma_2 A_2,$$

where $\sigma_2$ is the maximum adhesion strength between the second metal layer 42 and/or the third metal layer 43 and the underlying dielectric material, and $A_2$ is the cumulative top view outer profile area 80 for the embodiment (see e.g., FIGS. 4 and 6). If it is assumed that all other factors (materials, size and shape of bond pad and first metal plate) are the same for purposes of discussion and comparison, then $\sigma_2 = \sigma_1$, and thus:

$$F_2 = \sigma_1 A_2.$$

Therefore, as the effective area ($A_2$) increases (i.e., the cumulative top view outer profile area), the amount of tensile force ($F_2$) that the bond pad structure can withstand before peeling occurs increases as well. This may be expressed in terms of percent reinforcement provided by an increase in area ($\Delta A$), where $A_2 = A_1 + \Delta A$, as follows:

$$\begin{aligned}\% \text{ reinforcement} &= (F_2 - F_1)/F_1 \\ &= (\sigma_1 A_2 - \sigma_1 A_1)/\sigma_1 A_1 = (A_2 - A_1)/A_1 \\ &= (\Delta A + A_1 - A_1)/A_1 = \Delta A / A_1.\end{aligned}$$

The increase in area may also be expressed as follows:

$$\Delta A = x A_2,$$

where x is some fraction of the cumulative top view outer profile area of an embodiment. In such case, the percent reinforcement may be expressed as follows:

$$\% \text{ reinforcement} = \Delta A / A_1 = x A_2 / A_1.$$

Figure 8:
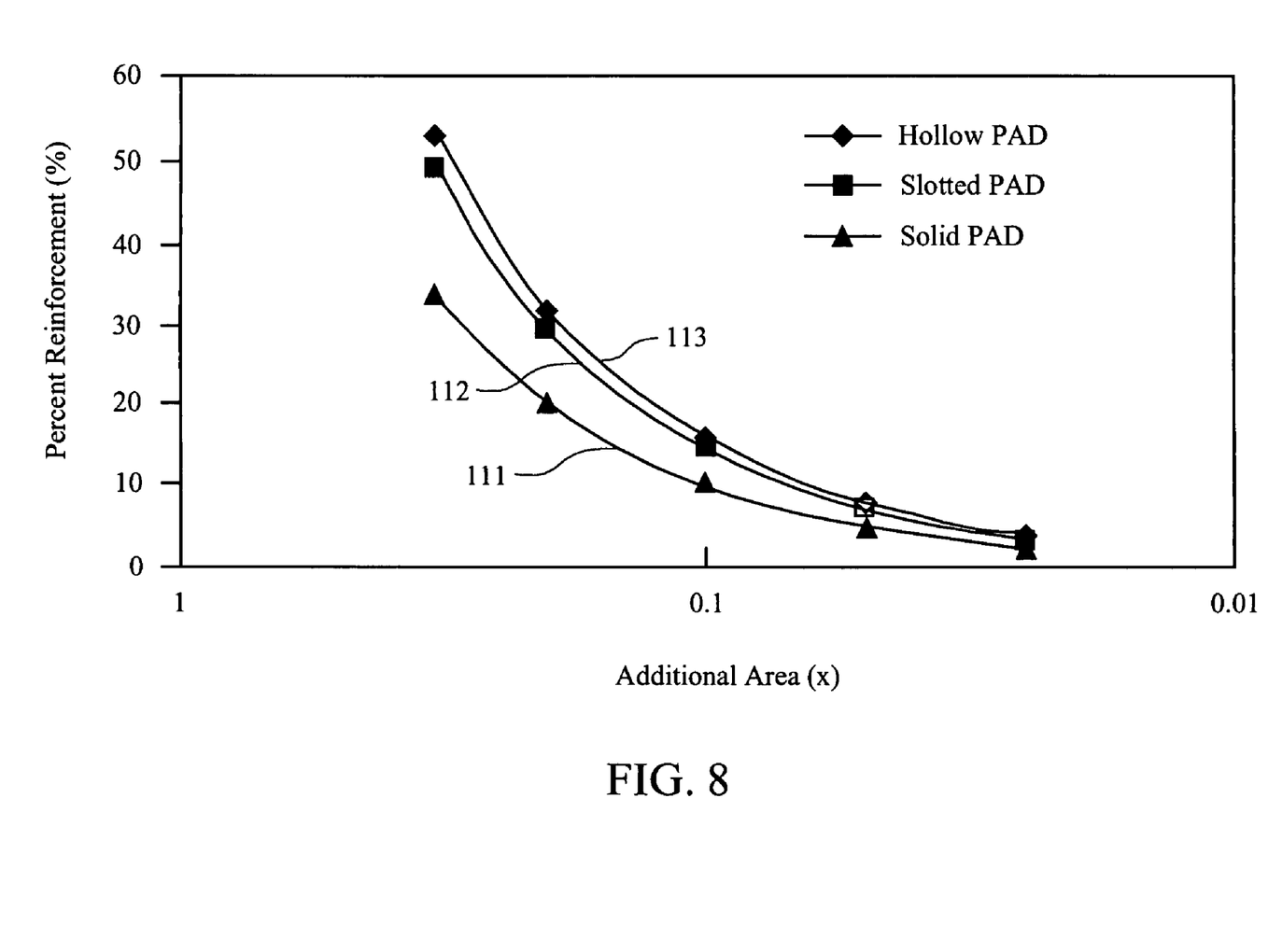
FIG. 8 is a graph illustrating the percentage of bond pad reinforcement obtained by increasing the effective area using an embodiment of the present invention.

The graph in FIG. 8 shows three curves to illustrate how the percent reinforcement provided by an embodiment (compared to the alternative design) may increase as the additional area ($\Delta A$) increases or as the fraction x increases. A first curve 111 of FIG. 8 is for an embodiment where the first, second, and third metal plates 41, 42, 43 are solid. A second curve 112 of FIG. 8 is for an embodiment where the first metal plate 41 is slotted and the second and third metal plates 42, 43 are solid. And, a third curve 113 of FIG. 8 is for an embodiment where the first metal plate 41 has a hollow central portion 54 and the second and third metal plates 42, 43 are solid. As illustrated in FIG. 8 and by the above simplified equations, the percentage of reinforcement increases as the effective pulling area (i.e., the cumulative top view outer profile area 80 of the bond pad structure) increases.

Regarding the materials of an embodiment of the present invention, the metal plates (41, 42, 43, 98) may be made from a same material or different materials (e.g., first metal plate made of a different material than the second metal plate). A metal plate of an embodiment may be made from any suitable structural material, including (but not limited to): copper, aluminum, titanium, tungsten, alloys thereof, composites thereof, or combinations thereof, for example. Likewise, the bond pad portion 38 of the bond pad structure for an embodiment may be made from any suitable structural material, including (but not limited to): copper, aluminum, titanium, tungsten, alloys thereof, composites thereof, or combinations thereof, for example. Furthermore, the vias (51, 52) of an embodiment may be made from any suitable structural material, including (but not limited to): copper, aluminum, titanium, tungsten, alloys thereof, composites thereof, or combinations thereof, for example. The dielectric materials surrounding and below the bond pad structure may be any suitable dielectric material, including (but not limited to) low-k dielectric materials, ultra low-k dielectric materials, oxides, nitrides, oxynitrides, and combinations thereof, for example.

Although the embodiments shown and described have three metal plates at three levels, bond pad structures of other embodiments may have only two metal plates at two levels, for example. Also, bond pad structures of other embodiments may have four, five, or six metal plates on different levels, for example.

Although embodiments of the present invention and at least some of its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit chip comprising a bond pad structure, wherein the bond pad structure comprises:
   a bond pad having a bond pad outer profile area;
   a first metal plate located under the bond pad, the first metal plate having a first outer profile area, wherein the first outer profile area is substantially equal to or larger than the bond pad outer profile area;
   a second metal plate located under the first metal plate, the second metal plate having a second outer profile area, wherein the second outer profile area is larger than the first outer profile area; and
   a third metal plate located under the second metal plate, the third metal plate having a third outer profile area, wherein the third outer profile area is larger than the second outer profile area.

2. The chip of claim 1, wherein a first vertical axis extends through a centroid of the first metal plate, wherein a centroid of the second metal plate is laterally offset relative to the first vertical axis.

3. The chip of claim 1, wherein the bond pad structure further comprises vias connecting between the first metal plate and the second metal plate.

4. The chip of claim 1, wherein the first metal plate has a hollow central portion.

5. The chip of claim 1, wherein the first metal plate has slots formed therein.

6. The chip of claim 1, wherein the first metal plate has a solid plate structure.

7. The chip of claim 1, further comprising at least part of an integrated circuit located under the bond pad structure.

8. The chip of claim 1, wherein the bond pad, the first metal plate, and the second metal plate are electrically connected.

9. The chip of claim 1, wherein a vertical axis extending through a centroid of the third metal plate is offset relative to a vertical axis extending through a centroid of the first metal plate.

10. The chip of claim 9, wherein a cumulative top view outer profile area of the first, second, and third metal plates is larger than the third outer profile area.

11. An integrated circuit chip comprising a bond pad structure, wherein the bond pad structure comprises:
    a bond pad;
    a first metal plate located under the bond pad, the first metal plate having a first outer profile area;
    a second metal plate located under the first metal plate, the second metal plate having a second outer profile area, wherein the second outer profile area is larger than the first outer profile area, and wherein a first vertical axis extends through a centroid of the first metal plate and through a centroid of the second metal plate; and
    a third metal plate located under the second metal plate, the third metal plate having a third outer profile area, wherein the third outer profile area is larger than the second outer profile area.

12. The chip of claim 11, wherein the first metal plate has a hollow central portion.

13. The chip of claim 11, wherein the first metal plate has slots formed therein.

14. The chip of claim 11, wherein the first metal plate has a solid plate structure.

15. The chip of claim 11, wherein the bond pad has a bond pad outer profile area, and wherein the first outer profile area is substantially equal to or larger than the bond pad outer profile area.

16. The chip of claim 11, further comprising at least part of an integrated circuit located under the bond pad structure.

17. The chip of claim 11, wherein the bond pad, the first metal plate, and the second metal plate are electrically connected.

18. The chip of claim 11, wherein a vertical axis extending through a centroid of the third metal plate is laterally offset relative to the first vertical axis, and wherein a cumulative top view outer profile area of the first, second, and third metal plates is larger than the third outer profile area.

19. The chip of claim 11, wherein the bond pad structure further comprises a first set of vias connecting between the first metal plate and the second metal plate.

* * * * *